United States Patent
Kobayashi et al.

(10) Patent No.: US 7,649,383 B2
(45) Date of Patent: Jan. 19, 2010

(54) BIDIRECTIONAL LEVEL SHIFT CIRCUIT AND BIDIRECTIONAL BUS SYSTEM

(75) Inventors: Hitoshi Kobayashi, Osaka (JP); Keiichi Fujii, Shiga (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/042,677

(22) Filed: Mar. 5, 2008

(65) Prior Publication Data

US 2008/0218213 A1  Sep. 11, 2008

(30) Foreign Application Priority Data

Mar. 8, 2007  (JP) .............................. 2007-058680

(51) Int. Cl.
*H03K 19/094* (2006.01)

(52) U.S. Cl. .............................. 326/81; 326/64; 326/68; 326/75; 326/84; 326/113; 327/109; 327/333; 710/307; 710/313

(58) Field of Classification Search ............. 326/63–64, 326/68, 75, 80–84, 86, 112–113; 327/108–109, 327/333; 710/305–307, 313
See application file for complete search history.

(56) References Cited

U.S. PATENT DOCUMENTS

| | | | | |
|---|---|---|---|---|
| 5,689,196 A * | 11/1997 | Schutte | ........................ | 326/86 |
| 5,808,502 A * | 9/1998 | Hui et al. | ..................... | 327/333 |
| 6,806,757 B2 * | 10/2004 | Mukai | ......................... | 327/333 |
| 6,822,480 B1 * | 11/2004 | McCalmont | ................. | 326/81 |
| 6,891,764 B2 * | 5/2005 | Li | ......................... | 365/189.15 |
| 7,259,589 B1 * | 8/2007 | Hui et al. | ..................... | 326/63 |
| 2004/0032284 A1 * | 2/2004 | Kumar | ........................ | 326/81 |
| 2005/0057296 A1 * | 3/2005 | Dharne et al. | ............... | 327/333 |
| 2006/0238219 A1 * | 10/2006 | Takiba | ......................... | 326/63 |

FOREIGN PATENT DOCUMENTS

JP  2004-506979 A  3/2004
WO  WO 02/15013 A2  2/2002

OTHER PUBLICATIONS

Philips Semiconductors, I²C Bus Specification, Version 2.1, Jan. 2000, with English translation.
Hitachi, Ltd. et al, "High Definition Multimedia Interface", Specification Version 1.3a, Nov. 10, 2006.

* cited by examiner

*Primary Examiner*—Vibol Tan
*Assistant Examiner*—Jason Crawford
(74) *Attorney, Agent, or Firm*—RatnerPrestia

(57) ABSTRACT

A plurality of transistors are connected between an I²C bus operating at a first voltage level and an I²C bus operating at a second voltage level and a main control electrode of at least one transistor is connected to a first power supply terminal and a main control electrode of the other at least one transistor is connected to an intermediate level between the first voltage level and the second voltage level, whereby a withstand voltage required to a transistor of the bidirectional level shift circuit of the I²C bus can be lowered.

9 Claims, 5 Drawing Sheets

BIDIRECTIONAL LEVEL SHIFT CIRCUIT AND BIDIRECTIONAL BUS SYSTEM

BACKGROUND OF THE INVENTION

1. Field of the Invention

The present invention relates to a bidirectional bus system capable of bidirectional communication between two or more equipments, and more particularly, to a bidirectional level shift circuit used in a bidirectional bus system such as an I²C bus.

2. Description of the Related Art

The I²C bus developed by Phillips Corporation is used in a system for controlling various kinds of LSI (large-scale integration circuit). Recently, a HDMI (High Definition Multimedia Interface) standard connecting a digital television and a DVD (digital versatile disk) equipment by a high-speed digital base band communication has been developed as HDMI version 1.3 specification. According to the HDMI standard, the I²C bus operating with a power supply voltage of 5V is used for a DDC (Display Data Channel) that is a signal line for communicating display information between a transmitting side and a receiving side, and a signal line of a differential current mode operating with a power supply voltage of 3.3V is used for a TMDS (Transition Minimized Differential Signaling) line for communicating a high-speed image and audio digital data.

Therefore, equipment having a HDMI interface is mostly equipped with both an LSI operated with a power supply of 3.3V and an LSI operated with a power supply of 5V, and in many cases, a bidirectional level shift circuit is needed for converting a DDC signal for 3.3V outputted from a control microcomputer and the like to a DDC signal for 5V based on the HDMI standard. Thus, a level shift circuit for use in the I²C bus disclosed in the I²C Bus Specification Version 2.1 developed by Phillips Corporation or disclosed in the Japanese Translation Publication No. 2004-506979 is used for connecting the I²C bus for 3.3V system and the I²C bus for 5V system.

Here, an operation of a bidirectional level shift circuit defined in the I²C bus specification version 2.1 is described with reference to FIG. 6. In the bidirectional level shift circuit shown in FIG. 6, an I²C bus 611 (comprised of a serial data line SDA1 and a serial clock line SCL1) operating at a power supply voltage $V_{DD1}$ of 3.3V is connected to an I²C bus 612 (comprised of a serial data line SDA2 and a serial clock line SCL2) operating at a power supply voltage $V_{DD2}$ of 5V through a pair of N-type MOS transistors 68 contained in a semiconductor device 69. Each gate terminal of the pair of N-type MOS transistors 68 is connected to the power supply $V_{DD1}$ of 3.3V. In addition, the I²C bus signal lines 611 on the 3.3V side and the I²C bus signal lines 612 on the 5V side are respectively connected to the 3.3V power supply $V_{DD1}$ and the 5V power supply $V_{DD2}$ through pull-up resistors Rp1 and Rp2. Here, reference numeral 61 denotes a first power supply terminal which receives the first voltage level, 62 designates a first signal terminal operating at the first voltage level, and 64 designates a second signal terminal operating at the second voltage level.

The operation in the case of communication directed from the I²C bus 611 on the 3.3V side to the I²C bus 612 on the 5V side is firstly described. When a signal on the 3.3V side is at a level of 3.3V that is a logic value of H (high) level, a gate-source voltage $V_{GS}$ of each N-type MOS transistor 68 is less than a threshold voltage thereof and the N-type MOS transistor is in OFF state. Therefore, the signal on the 5V side becomes a level of 5V that is a logic value of H level through the pull-up resistors Rp2. On the contrary, when the signal on the 3.3V side is at a level of 0V that is a logic value of L (low) level, a voltage more than the threshold voltage is applied as the gate-source voltage $V_{GS}$ of the N-type MOS transistor 68, so that the N-type MOS transistor 68 becomes ON state. Thus, the signal on the 5V side can be lowered to L level.

Next, the operation in the case of communication directed from the I²C bus 612 on the 5V side to the I²C bus 611 on the 3.3V side will be described. When a signal on the 5V side is at a level of 5V that is a logic value of H (high) level, a gate-source voltage $V_{GS}$ of each N-type MOS transistor 68 is less than the threshold voltage thereof and the N-type MOS transistor 68 is in OFF state. Therefore, the signal on the 3.3V side becomes a level of 3.3V that is a logic value of H level through the pull-up resistors Rp1. On the contrary, when the signal on the 5V side is at a level of 0V that is a logic value of L (low) level, a voltage more than the threshold voltage is applied as the gate-source voltage $V_{GS}$ of the N-type MOS transistor 68, so that the transistor 68 becomes ON state. Thus, the signal on the 3.3V side can be lowered to L level.

Thus, according to the bidirectional level shift circuit described in the I²C bus specification version 2.1 shown in FIG. 6, the I²C bus on the 3.3V side and the I²C bus on the 5V side are connected by a wired AND so that the bidirectional communication can be implemented between the above two I²C buses. In addition, this circuit configuration has an advantage such that, in the case where the power supply $V_{DD1}$ on the 3.3V side and the power supply $V_{DD2}$ on the 5V side are applied at the same time, only a voltage less than a voltage difference between the two power supply voltages is applied to the gate-source $V_{GS}$ and the gate-drain $V_{GD}$ of each N-type MOS transistor 68. Therefore, a withstand voltage between the gate and source and between the gate and drain of the N-type MOS transistor 68 can be lowered. Thus, even the level shift circuit between 3.3V and 5V can be configured by an N-type MOS transistor having a withstand voltage of 3.3V between the gate and source and between the gate and drain.

However, in the conventional bidirectional level shift circuit described in the I²C bus specification version 2.1 shown in FIG. 6, there is a problem that, in the case where the power supply $V_{DD1}$ on the 3.3V side drops to 0V while the power supply on the 5V side is continuously applied, the $V_{GD}$ of 5V is applied between the gate and drain of the N-type MOS transistor 68. Therefore, in the conventional bidirectional level shift circuit shown in FIG. 6, it is necessary to use an N-type MOS transistor with a gate oxide film having a withstand voltage of 5V or more between the gate and source and between the gate and drain under the usage condition that the power supply on the 3.3V side drops to 0V while the power supply on the 5V side is being applied.

Meanwhile, since a process for a high-speed operation at an order of GHz such as TMDS signal of HDMI uses a very fine CMOS having a gate length of less than 110 to 130 nm, or a high-frequency Bi-CMOS using a SiGe-HBT (Heterojunction Bipolar Transistor), it is very difficult to integrate a level shift circuit between a super-fast TMDS signal using a 3.3V power supply and a DDC signal using a 5V power supply in one semiconductor device.

SUMMARY OF THE INVENTION

In view of the above problems, it is a main object of the present invention to provide a bidirectional level shift circuit for a I²C bus using an N-type MOS transistor formed of a gate oxide film having a withstand voltage of 3.3V between gate and source and between gate and drain or using a bipolar junction transistor having a withstand voltage of 3.3V as an ON/OFF control transistor connected between an I²C bus on a lower voltage side of 3.3V and an I²C bus on a higher voltage side of 5V, and having no problem even when a power supply on the 3.3V side drops to 0V while a power supply on the 5V side is continuously applied. Meanwhile, the present invention has an object to enable a bidirectional level shift circuit between a super-fast TMDS signal using a 3.3V power supply and a DDC signal using a 5V power supply to be incorporated in one semiconductor device.

In order to attain the above object, a bidirectional level shift circuit according to the present invention is used in a bus system capable of transmitting and receiving information bidirectionally among a plurality of equipments and includes a semiconductor device connected between a first signal line for performing bidirectional communication using a first voltage level and a second signal line for performing bidirectional communication using a second voltage level higher than the first voltage level The semiconductor device includes a plurality of ON/OFF control transistors connected between the first signal line and the second signal line. At least one of the plurality of ON/OFF control transistors has a control terminal connected to a first power supply terminal receiving the first voltage level, and at least one of the other plurality of ON/OFF control transistors has a control terminal connected to an intermediate voltage level between the first voltage level and the second voltage level.

In this construction, preferably, the control terminal of the ON/OFF control transistor may be a gate terminal of a field effect transistor or a base terminal of a bipolar junction transistor.

According to the bidirectional level shift circuit of the present invention, when voltages are applied as the first voltage level and second voltage level, for example, when the first voltage level is 3.3V and the second voltage level is 5V, the bidirectional level shift circuit operates similarly to the conventional bidirectional level shift circuit shown in FIG. 6. Meanwhile, even when the first voltage level drops to 0V and the second voltage level becomes 5V, since the control terminal of the ON/OFF control transistor connected to the second voltage level is set to be an intermediate voltage level between the first voltage level and the second voltage level, only a voltage lower than the second voltage level is applied between the control terminal and a main electrode terminal thereof, so that the ON/OFF control transistor having a low withstand voltage can be used.

Specifically, in the case where the control terminal of the ON/OFF control transistor is a gate terminal of a field effect transistor or a base terminal of a bipolar junction transistor, since the gate terminal of the field effect transistor or the base terminal of the bipolar junction transistor connected to the second voltage level is set to be the intermediate voltage between the first voltage level and the second voltage level, only a voltage lower than the second voltage level is applied between the gate and drain of the field effect transistor or applied between the base and collector of the bipolar junction transistor connected to the second voltage level, so that the field effect transistor or the bipolar junction transistor having a low withstand voltage can be used.

DESCRIPTION OF THE PREFERRED EMBODIMENTS

Hereinafter, preferred embodiments of a bidirectional level shift circuit according to the present invention are described with reference to the attached drawings of FIGS. 1 to 5. In addition, the same references are allotted to the common components in each drawing and their description will be omitted.

First Embodiment

Figure 1:
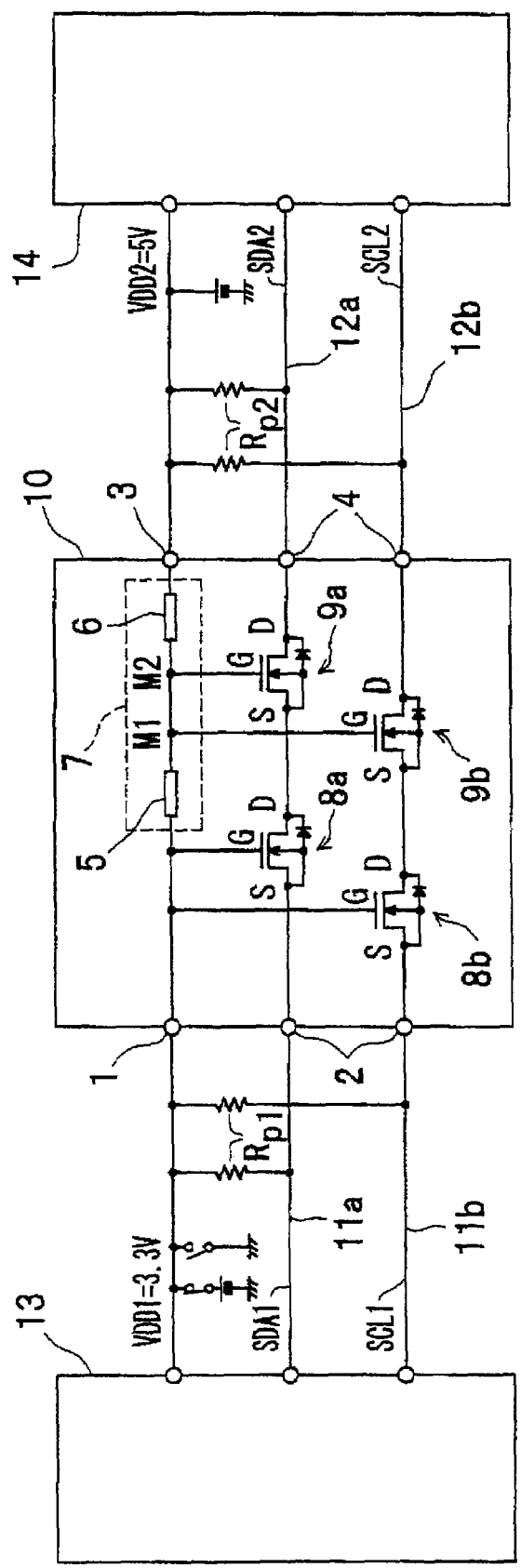
FIG. 1 is a view showing a circuit configuration of a bidirectional level shift circuit according to a first embodiment of the present invention.

FIG. 1 shows a circuit configuration of a bidirectional level shift circuit used in a bidirectional bus system according to a first embodiment of the present invention. As shown in FIG. 1, the bidirectional level shift circuit according to the first embodiment of the present invention includes a semiconductor device 10 having plural pairs of ON/OFF control transistors connected between a first signal line pair 11a and 11b and a second signal line pair 12a and 12b. The first signal line pair 11a and 11b performs bidirectional communication using a power supply of a first voltage level $V_{DD1}$ of e.g. 3.3V and the second signal line pair 12a and 12b performs bidirectional communication using a power supply of a second voltage level $V_{DD2}$ of e.g. 5V, so that the bidirectional communication of signal transmission and reception can be implemented between two or more equipments. In this example, an equipment 13 is connected to the first signal line pair 11a and 11b and another equipment 14 is connected to the second signal line pair 12a and 12b.

Here, reference numeral 1 designates a first power supply terminal which receives the first voltage level $V_{DD1}$, 2 designates a first signal terminal operating at the first voltage level, 3 designates a second power supply terminal which receives the second voltage level $V_{DD2}$, and 4 designates a second signal terminal operating at the second voltage level. The first signal lines 11a and 11b are respectively a serial data line SDA1 and a serial clock line SCL1, and the second signal lines 12a and 12b are respectively a serial data line SDA2 and a serial clock line SCL2.

The circuit configuration of the semiconductor device 10 constituting the bidirectional level shift circuit includes a first set of N-type MOS transistors 8a and 8b and a second set of N-type MOS transistors 9a and 9b as the ON/OFF control transistors which are connected between the first signal line pair 11a and 11b and the second signal line pair 12a and 12b. More specifically, the N-type MOS transistors 8a and 9a are serially connected between the first and second signal lines 11a and 12a. Similarly, the N-type MOS transistors 8b and 9b are serially connected between the first and second signal lines 11b and 12b. Furthermore, the semiconductor device 10 includes a bias circuit 7 connected between the first power supply terminal 1 to which the first voltage level is applied and the second power supply terminal 3 to which the second voltage level is applied, so that the bias circuit 7 generates an intermediate voltage between the first voltage level and the second voltage level. In a preferable example, the bias circuit is comprised of a voltage dividing resistive circuit (i.e., voltage divider) connected between the first power supply terminal and the second power supply terminal. In specific, the voltage dividing resistive circuit 7 includes a first and second voltage dividing resistors 5 and 6 which are connected in series between the first power supply terminal 1 and the second power supply terminal 3, so that the first voltage dividing resistor 5 is supplied with the first voltage level $V_{DD1}$ and the second voltage dividing resistor 6 is supplied with the second voltage level $V_{DD2}$.

In this configuration, each gate terminal G1 of the first set of N-type MOS transistors 8a and 8b is connected to the first power supply terminal 1 to which the first voltage level $V_{DD1}$ is supplied and a gate voltage $V_{G1}$ thereof is set to be $V_{DD1}$ (i.e., $V_{G1}=V_{DD1}$). Meanwhile, each gate terminal G2 of the second set of N-type MOS transistors 9a and 9b is connected to an intermediate point (M1, M2) between the resistors 5 and 6 of the voltage dividing resistive circuit 7 so that a gate voltage $V_{G2}$ thereof is set to be an intermediate voltage level $V_{MID}$ (i.e., $V_{G2}=V_{MID}$) where $V_{DD1}<V_{MID}<V_{DD2}$ according to a resistive-voltage dividing ratio. For example, the resistive voltage division is set to be a half of the first and second voltage levels $V_{DD1}$ and $V_{DD2}$, that is, $V_{G2}=(V_{DD1}+V_{DD2})/2$. Thus, when the first voltage level is 3.3V and the second voltage level is 5V, 3.3V is applied to the gate terminals of the first set of N-type MOS transistors 8a and 8b, and 4.15V that is an intermediate voltage of 3.3V and 5V is applied to the gate terminals of the second set of N-type MOS transistors 9a and 9b from the intermediate point (M1, M2) between the resistors 5 and 6. In this case, when the second signal line pair 12a and 12b drops to 0V level, a gate-drain voltage $V_{GD}$ of 4.15V is applied between gate and drain of each of the second set of N-type MOS transistors 9a and 9b, and this voltage of 4.15V is a maximum voltage applied to the first and second sets of N-type MOS transistors 8a, 8b and 9a, 9b.

Meanwhile, when the first voltage level $V_{DD1}$ drops to 0V and the second voltage level $V_{DD2}$ is 5V, the voltage of 0V is applied to the gate terminals of the first set of N-type MOS transistors 8a and 8b, and the voltage of 2.5V (that is the intermediate voltage of 0V and 5V) is applied to the gate terminals of the second set of N-type MOS transistors 9a and 9b. In this case, when the voltage level of the second signal line pair 12a and 12b drops to 0V level, the voltage of 2.5V as the gate-drain voltage $V_{GD}$ is applied between the gate and drain of each of the second set of N-type MOS transistors 9a and 9b, and when the second signal line pair 12a and 12b is 5V level, the voltage of −2.5V as the gate-drain voltage $V_{GD}$ is applied between the gate and drain of each of the second set of N-type MOS transistors 9a and 9b.

Therefore, according to the first embodiment of the present invention shown in FIG. 1, a withstand voltage of 4.15V between the gate and drain and between the gate and source of each of the first and second sets of N-type MOS transistors can be satisfactory as required when the first voltage level is 3.3V and the second voltage level is 5V. It is noted here that, although the voltage division ratio is 1/2 to simplify the description in this example, the voltage applied to the gate terminals, that is, applied between the gate and drain and between the gate and source can be lowered by changing the voltage division ratio.

Second Embodiment

Figure 2:
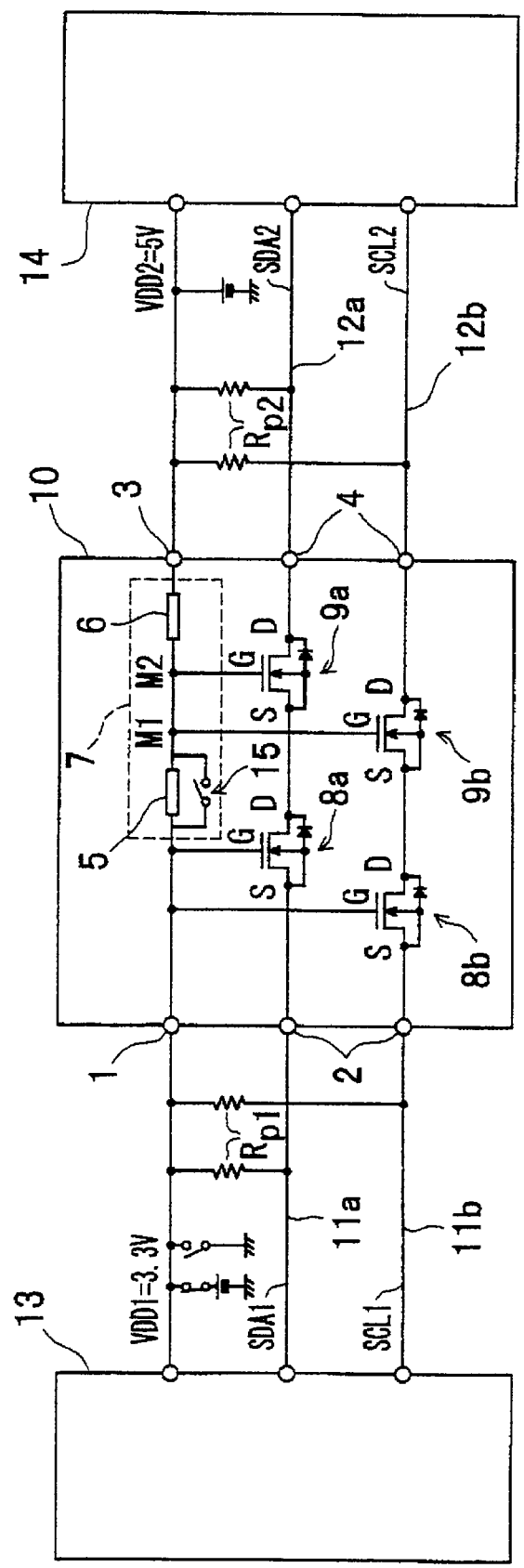
FIG. 2 is a view showing a circuit configuration of a bidirectional level shift circuit according to a second embodiment of the present invention.

Next, a bidirectional level shift circuit according to a second embodiment of the present invention will be described with reference to FIG. 2. FIG. 2 shows a circuit configuration of the bidirectional level shift circuit used in a bidirectional bus system according to the second embodiment of the present invention. The bidirectional level shift circuit according to the second embodiment shown in FIG. 2 is characterized by adding a switch circuit 15 to the configuration of the first embodiment shown in FIG. 1, where the switch circuit 15 is connected in parallel to the first resistor 5 of the voltage dividing resistive circuit 7.

The switch circuit 15 is controlled in such a manner that, when the first voltage level $V_{DD1}$ and the second voltage level $V_{DD2}$ are respectively applied to the first power supply terminal 1 and the second power supply terminal 3, the gate voltage $V_{G2}$ applied to gate terminals of second set of N-type MOS transistors 9a and 9b becomes equal to the first voltage level $V_{DD1}$ by closing the switch 15, and when the first voltage level $V_{DD1}$ drops to 0V, the switch 15 is opened. Thus, when the first voltage level $V_{DD1}$ becomes 0V, the gate voltage $V_{G2}$ applied to each gate terminal of the second set of N-type MOS transistors 9a and 9b is switched to an intermediate voltage level $V_{MID}$ of the first voltage level $V_{DD1}$ and the second voltage level $V_{DD21}$.

Thus, in the case where the first voltage level $V_{DD1}$ is 3.3V and the second voltage level is 5V, for example, since the switch circuit 15 is closed, a gate voltage $V_{DD1}$ of 3.3V is applied to each gate terminal of the first set of N-type MOS transistors 8a and 8b and the second set of N-type MOS transistors 9a and 9b. In this case, when the voltage level of the second signal line pair 12a and 12b drops to 0V, the gate-drain voltage $V_{GD}$ applied between each gate and drain of the second set of N-type MOS transistors 9a and 9b becomes 3.3V, and this voltage of 3.3V is a maximum voltage applied to the first set of N-type MOS transistors 8a and 8b and the second set of N-type MOS transistors 9a and 9b.

Meanwhile, when the first voltage level $V_{DD1}$ drops to 0V and the second voltage level $V_{DD2}$ is 5V, the switch circuit 15 is opened and the gate voltage $V_{G1}$ of 0V is applied to each gate terminal of the first set of N-type MOS transistors 8a and 8b, and the gate voltage $V_{G2}$ of 2.5V that is the intermediate voltage of 0V and 5V is applied to each gate terminal of the second set of N-type MOS transistors 9a and 9b when the voltage division ratio is 1/2. In this case, when the voltage level of the second signal line pair 12a and 12b drops to 0V, the gate-drain voltage $V_{GD}$ applied between each gate and drain of the second set of N-type MOS transistors 9a and 9b becomes 2.5V, and when the voltage level of the second signal line pair 12a and 12b is 5V, the gate-drain voltage $V_{GD}$ applied between each gate and drain of the second set of N-type MOS transistors 9a and 9b becomes −2.5V.

Therefore, according to the second embodiment of the present invention shown in FIG. 2, a withstand voltage of 3.3V between the gate and drain and between the gate and source of each of the first and second sets of N-type MOS transistors can be satisfactory as required when the first voltage level is 3.3V and the second voltage level is 5V. Thus, the withstand voltage can be lower than that of the first embodiment shown in FIG. 1.

Third Embodiment

Figure 3:
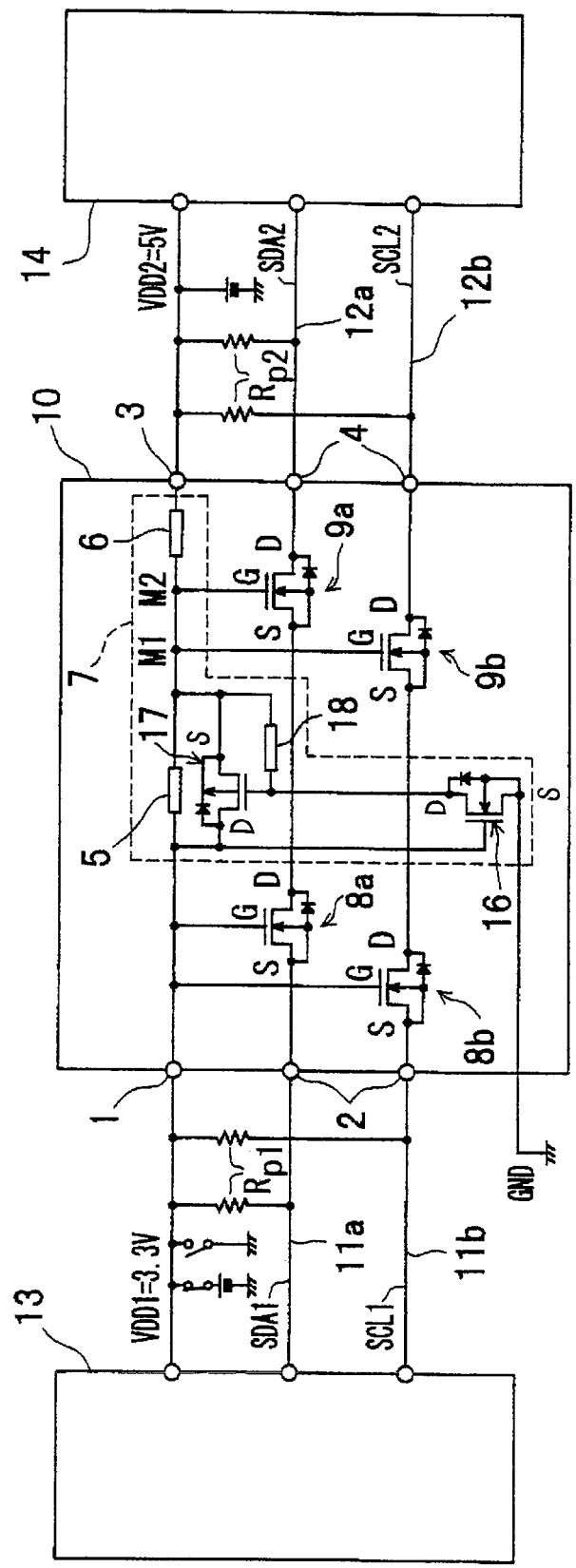
FIG. 3 is a view showing a circuit configuration of a bidirectional level shift circuit according to a third embodiment of the present invention.

Next, a bidirectional level shift circuit according to a third embodiment of the present invention will be described with reference to FIG. 3. FIG. 3 shows a circuit configuration of the bidirectional level shift circuit used in a bidirectional bus system according to the third embodiment of the present invention. The bidirectional level shift circuit of the third embodiment shows a more specific circuit configuration of the switch circuit 15 shown in FIG. 2. The switch circuit shown in FIG. 3 includes an N-type MOS transistor 16 and a P-type MOS transistor 17. The P-type MOS transistor 17 is connected in parallel to the resistor 5 between the first power supply terminal 1 and the middle point (M1, M2) of the first and second resistances 5 and 6 included in the voltage dividing circuit 7. The gate terminal of the P-type MOS transistor 17 is connected to a drain of the N-type MOS transistor 16 and also connected to the middle point (M1, M2) of the voltage dividing circuit 7 through a resistor 18. In addition, the gate terminal of the N-type MOS transistor 16 is connected to the first power supply terminal 1 and the source terminal thereof is connected to the ground (GND) potential.

Next, an operation of the above configuration will be described. When a voltage of 3.3V is applied to the first power supply terminal 1, since the N-type MOS transistor 16 becomes ON state, the gate voltage of the P-type MOS transistor 17 becomes the ground (GND) potential, so that a voltage more than a threshold voltage thereof is applied as the gate-source voltage $V_{GS}$ between the gate and source of the P-type MOS transistor 17, and the P-type MOS transistor 17 becomes ON state. Meanwhile, when the voltage level of the first power supply terminal 1 drops to 0V, since the N-type MOS transistor 16 becomes OFF state, the P-type MOS transistor 17 is turned OFF. Thus, the specific circuit configuration of the switch circuit 15 added in the second embodiment shown in FIG. 2 can be implemented, where a switching operation of the switch circuit 15 is performed according to the voltage level of the first power supply terminal.

In the case where a first voltage level $V_{DD1}$ is set to 3.3V and a second voltage level $V_{DD2}$ is set to 5V in the circuit configuration shown in FIG. 3, a voltage more than 3.3V is not applied between gate and source or between gate and drain of each of the N-type MOS transistor 16 and P-type MOS transistor 17 constituting the switch circuit (15). Therefore, even when the power supply of 3.3V drops to 0V, there can be implemented a bidirectional level shift circuit which does not affect the operation of the second voltage level, by using a MOS transistor having a low withstand voltage of 3.3V.

Figure 4:
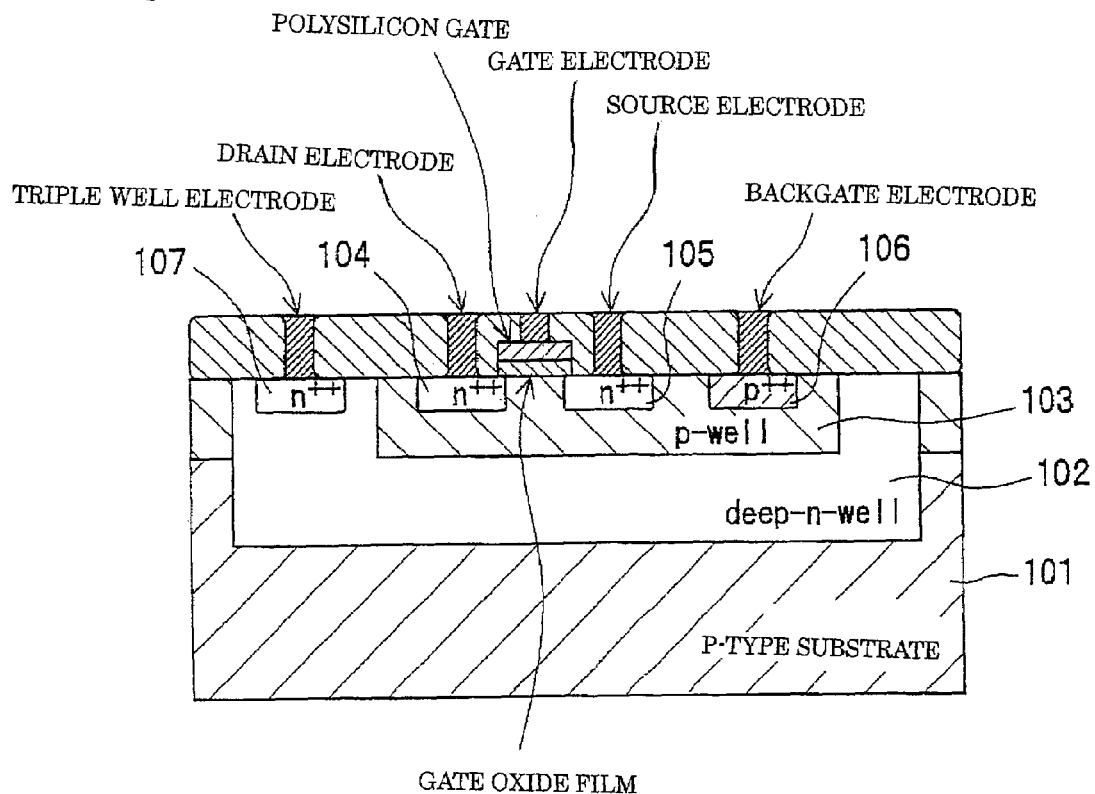
FIG. 4 is a sectional view showing an NMOS transistor having a triple well structure.

Next, a description will be made of a triple well structure of each of the first and second sets of N-type MOS transistors in the first to third embodiments with reference to FIG. 4. FIG. 4 shows a sectional view of a triple well structure of the N-type MOS transistor. That is, the ON/OFF control transistor is a field effect transistor connected between the first signal lines and the second signal lines. The field effect transistor is a N-channel MOS transistor having the triple well structure in which an N-type diffusion layer 102 is formed on a P-type substrate 101, and a P-well diffusion layer 103 is formed in the N-type diffusion layer 102, and the triple well structure is formed on the P-well diffusion layer 103.

More specifically, the first set of N-type MOS transistors 8a and 8b and the second set of N-type MOS transistors 9a and 9b mounted as the ON/OFF control transistors in FIGS. 1 to 3 necessarily have a structure in which each backgate thereof is electrically connected to each source terminal thereof. Therefore, as shown in FIG. 4, in the semiconductor device having the P-type substrate, the deep (N-type) well layer 102 is provided between the P well layer 103 of the N-type MOS transistor and the P-type substrate 101 to isolate the P well layer 103 from the P-type substrate 101. In the above constitution, a first N-type diffusion layer 104 is provided under a part of a gate electrode and a drain electrode, a second N-type diffusion layer 105 is provided under a part of the gate electrode and a source electrode, and a P-type diffusion layer 106 is provided under the backgate electrode in the P well layer 103. In addition, the N-type MOS transistor has a structure in which a third N-type diffusion layer 107 is embedded in the back deep (N-type) well layer 102 under a triple well electrode.

Figure 5:
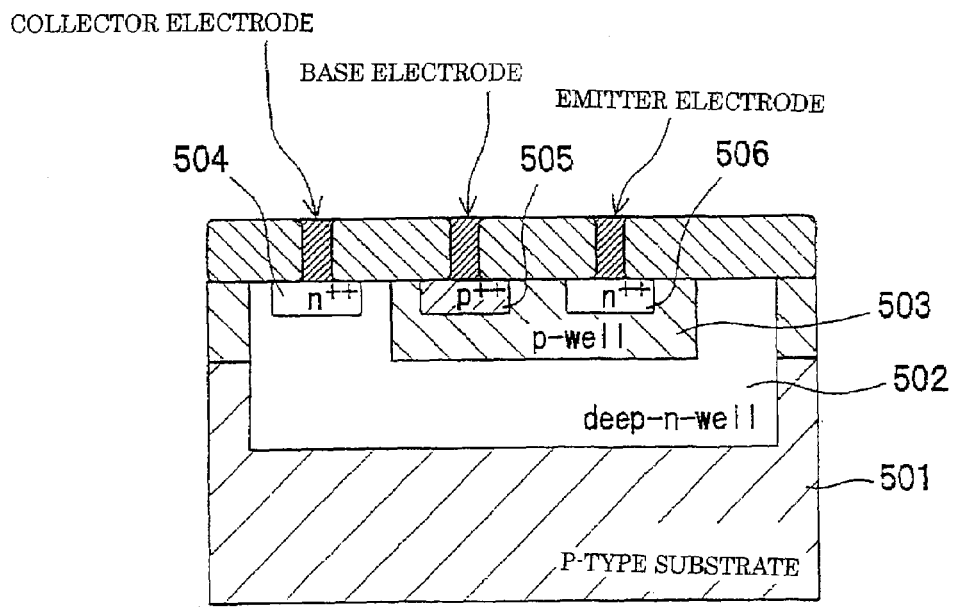
FIG. 5 is a sectional view showing an NPN transistor having a triple well structure.
Figure 6:
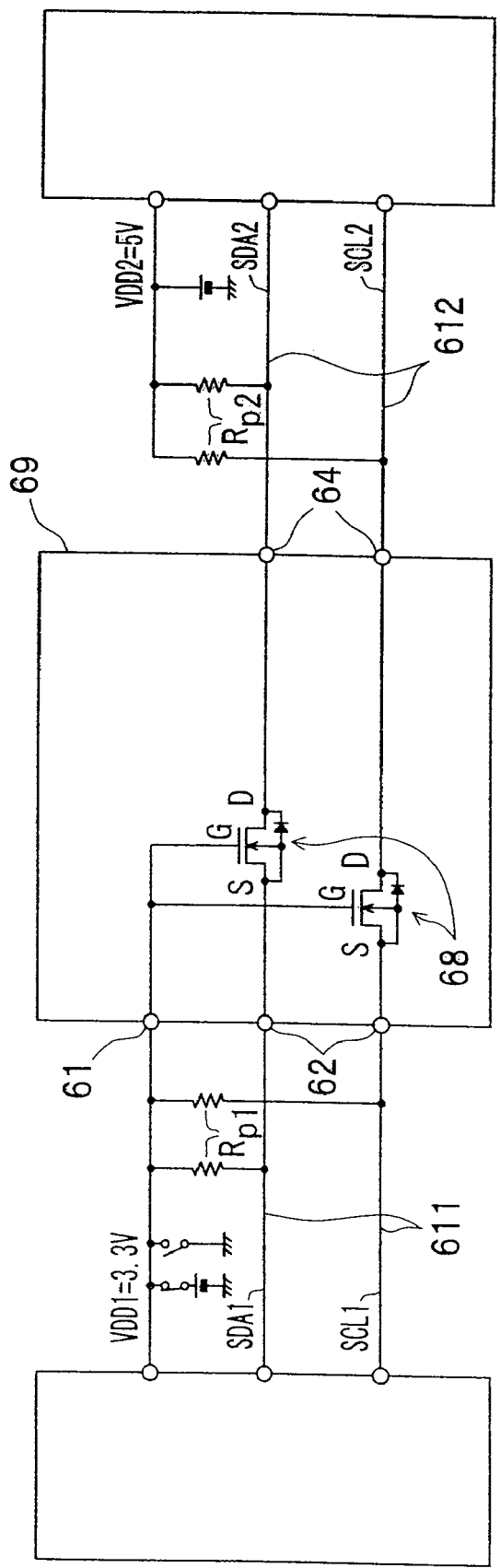
FIG. 6 is a view showing a circuit configuration of a conventional bidirectional level shift circuit.

It is noted here that, although a description has been made of the circuit using the N-type MOS transistors as the first and second sets of ON/OFF control transistors in the above first to third embodiments, the present invention is not limited to this. For example, the present invention can be applied to a bidirectional level shift circuit operating similarly using a bipolar junction transistor (BJT) as shown in FIG. 5, for example. In this sectional structure of the bipolar junction transistor, an NPN transistor includes an N-type diffusion layer 504 as a collector formed in a deep (N-type) well layer 502 on a P-type substrate or a P-type diffusion layer 501, and a P-type diffusion layer 505 as a base, and an N-type diffusion layer 506 as an emitter, formed in a P well layer 503.

As described above, the present invention is useful when a bidirectional level shift circuit having an I²C bus to convert a power supply voltage level from 3V to 5V, and in particular a bidirectional level shift circuit having an I²C bus for 5V level is mounted on a semiconductor device having a high-speed interface such as a DDC (Display Data Channel) that is a signal line communicating display information bidirectionally on the transmission side and the reception side according to the HDMI interface standard.

What is claimed is:

1. A bidirectional level shift circuit used in a bus system performing bidirectional communication among a plurality of equipments, comprising:
    a semiconductor device connected between a first signal line for performing bidirectional communication using a first voltage level and a second signal line for performing bidirectional communication using a second voltage level higher than the first voltage level,
    wherein said semiconductor device comprises a plurality of ON/OFF control transistors connected between the first signal line and the second signal line, at least one of the plurality of ON/OFF control transistors has a control terminal connected to a first power supply terminal which receives the first voltage level, and at least one of the other plurality of ON/OFF control transistors has a control terminal connected to an intermediate voltage level between the first voltage level and the second voltage level, and
    wherein said semiconductor device further comprises a bias circuit connected between the first power supply terminal receiving the first voltage level and the second power supply terminal receiving the second voltage level, so that said bias circuit generates an intermediate voltage between the first voltage level and the second voltage level.

2. The bidirectional level shift circuit according to claim 1, wherein the control terminal of the ON/OFF control transistor is a gate terminal of a field effect transistor or a base terminal of a bipolar junction transistor.

3. The bidirectional level shift circuit according to claim 1, wherein said bias circuit comprises a voltage dividing resistive circuit connected between the first power supply terminal and the second power supply terminal.

4. The bidirectional level shift circuit according to claim 3, wherein said bias circuit comprises a switch circuit switching the intermediate voltage to the first voltage level when a power supply voltage is applied to each of the first power supply terminal and the second power supply terminal.

5. The bidirectional level shift circuit according to claim 4, wherein said switch circuit comprises a switching transistor to switch a resistive voltage division of the voltage dividing resistive circuit.

6. The bidirectional level shift circuit according to claim 5, wherein a control terminal of the switching transistor constituting the switch circuit is connected to the first power supply terminal, and the switching operation of the switch circuit is controlled based on the first voltage level inputted to the first power supply terminal.

7. The bidirectional level shift circuit according to claim 1, wherein said ON/OFF control transistor is a field effect transistor connected between the first signal line and the second signal line, and said field effect transistor is an N-type MOS transistor having a triple well structure including an N-type diffusion layer formed on a P-type substrate, a P well diffusion layer formed in the N- type diffusion layer, said triple well structure being formed on the P well diffusion layer.

8. The bidirectional level shift circuit according to claim 1, wherein said ON/OFF control transistor is a bipolar junction transistor connected between the first signal line and the second signal line, and said bipolar junction transistor is an NPN transistor having an N-type diffusion layer as a collector formed on a P-type substrate or a P-type diffusion layer.

9. A bus system performing bidirectional communication among a plurality of equipments using a bidirectional level shift circuit, wherein said bidirectional level shift circuit comprises:

a semiconductor device connected between a first signal line for performing bidirectional communication using a first voltage level and a second signal line for performing bidirectional communication using a second voltage level higher than the first voltage level, wherein said semiconductor device comprises a plurality of ON/OFF control transistors connected between the first signal line and the second signal line, at least one of the plurality of ON/OFF control transistors has a control terminal connected to a first power supply terminal which receives the first voltage level, and at least one of the other plurality of ON/OFF control transistors has a control terminal connected to an intermediate voltage level between the first voltage level and the second voltage level, and wherein said semiconductor device further comprises a bias circuit connected between the first power supply terminal receiving the first voltage level and the second power supply terminal receiving the second voltage level, so that said bias circuit generates an intermediate voltage between the first voltage level and the second voltage level.

* * * * *